US012366595B2

(12) United States Patent
Huang et al.

(10) Patent No.: US 12,366,595 B2
(45) Date of Patent: Jul. 22, 2025

(54) VOLTAGE MONITORING SYSTEM, VOLTAGE MONITORING DEVICE AND VOLTAGE MONITORING METHOD

(71) Applicant: Realtek Semiconductor Corporation, Hsinchu (TW)

(72) Inventors: Yueh-Hsing Huang, Hsinchu (TW); Li-Chen Liu, Hsinchu (TW); Chun-Hsi Huang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 328 days.

(21) Appl. No.: 18/048,435

(22) Filed: Oct. 20, 2022

(65) Prior Publication Data
US 2023/0258696 A1 Aug. 17, 2023

(30) Foreign Application Priority Data
Feb. 14, 2022 (TW) .................................. 111105304

(51) Int. Cl.
| | |
|---|---|
| *G01R 19/165* | (2006.01) |
| *G01R 15/04* | (2006.01) |
| *G01R 15/14* | (2006.01) |
| *G01R 19/25* | (2006.01) |
| *G01R 31/385* | (2019.01) |
| *G01R 31/389* | (2019.01) |
| *G01R 31/392* | (2019.01) |
| *G01R 31/52* | (2020.01) |

(52) U.S. Cl.
CPC ....... *G01R 19/16576* (2013.01); *G01R 15/04* (2013.01); *G01R 15/146* (2013.01)

(58) Field of Classification Search
CPC ...... G01R 19/165; G01R 19/25; G01R 15/04; G01R 15/14; G01R 31/385; G01R 31/389; G01R 31/392; G01R 31/52
See application file for complete search history.

(56) References Cited

U.S. PATENT DOCUMENTS

| | | | |
|---|---|---|---|
| 10,591,947 B2 * | 3/2020 | Terasaki | G01R 19/16519 |
| 2021/0255651 A1 * | 8/2021 | Motz | G05F 1/571 |

\* cited by examiner

*Primary Examiner* — Neel D Shah
(74) *Attorney, Agent, or Firm* — CKC & Partners Co., LLC

(57) ABSTRACT

A voltage monitoring system includes a voltage dividing circuit and a voltage monitoring device. The voltage dividing circuit is configured to divide a power signal to generate an input voltage. The voltage monitoring device includes an input node, a shunt circuit, a first detection circuit and a second detection circuit. The input node receives the input voltage. The shunt circuit is configured to compare the input voltage with a voltage threshold value to selectively operate in a conducted state or a switched-off state, and configured to output a flag signal to indicate the conducted state or the switched-off state of the shunt circuit. The first detection circuit generates a first detection signal corresponding to the input voltage. The second detection circuit generates a second detection signal corresponding to the power signal according to the flag signal and the first detection signal.

12 Claims, 6 Drawing Sheets

VOLTAGE MONITORING SYSTEM, VOLTAGE MONITORING DEVICE AND VOLTAGE MONITORING METHOD

CROSS-REFERENCE TO RELATED APPLICATION

This application claims priority to Taiwan Application Serial Number 111105304, filed Feb. 14, 2022, which is herein incorporated by reference in its entirety.

BACKGROUND

Technical Field

The present disclosure relates to voltage monitoring technology, especially to a voltage monitoring system, a voltage monitoring device, and a related voltage monitoring method configured to automatically adjust the attenuation of input signal.

Description of Related Art

The universal serial bus type C (Type-C USB) interface has small size, high data transmission speed and strong power supply capability, so it is used by more and more notebook computers, tablet computers and smart phones. In order to meet the general charging needs of high-power electronic products such as gaming laptops and high-definition displays, USB Power Delivery Protocol 3.1 (USB PD 3.1 protocol) can support voltages up to 48V.

During the charging process, the power supply device (source) or the power consumption device (sink) can monitor the voltage change on the power line to stabilize the output voltage, or determine whether a fault event occurs. Since the withstand voltage of the semiconductor element gradually decreases with the progress of the manufacturing process, the voltage on the power line must be attenuated (or called scale down) before being input to the monitoring circuit to avoid damage to the semiconductor element. However, the voltage change of the power line becomes subtle after attenuation, and needs to be measured with a high-precision circuit, thus increasing the manufacturing difficulty and manufacturing cost of the overall circuit.

SUMMARY

One aspect of the present disclosure is a voltage monitoring system, comprising a voltage dividing circuit and a voltage monitoring device. The voltage dividing circuit is configured to divide a power signal to generate an input voltage. The voltage monitoring device comprising an input node, a shunt circuit, a shunt circuit, a first detection circuit and a second detection circuit. The input node is configured to receive the input voltage. The shunt circuit is coupled between the input node and a reference power terminal, is configured to compare the input voltage with a voltage threshold value to selectively operate in a conducted state or a switched-off state, and is configured to output a flag signal to indicate the conducted state or the switched-off state of the shunt circuit. The first detection circuit is coupled to the input node, and is configured to generate a first detection signal corresponding to a value of the input voltage. The second detection circuit is configured to generate, according to the flag signal and the first detection signal, a second detection signal corresponding to a value of the power signal.

Another aspect of the present disclosure is a voltage monitoring device configured to be coupled to a voltage dividing circuit. The voltage dividing circuit is configured to divide a power signal to generate an input voltage, and the voltage monitoring device comprises an input node, a shunt circuit, a first detection circuit and a second detection circuit. The input node is configured to receive the input voltage. The shunt circuit is coupled between the input node and a reference power terminal, is configured to compare the input voltage with a voltage threshold value to selectively operate in a conducted state or a switched-off state, and is configured to output a flag signal to indicate the conducted state or the switched-off state of the shunt circuit. The first detection circuit is coupled to the input node, and is configured to generate a first detection signal corresponding to a value of the input voltage. The second detection circuit is configured to generate a second detection signal corresponding to a value of the power signal according to the flag signal and the first detection signal.

Another aspect of the present disclosure is a voltage monitoring method, comprising: dividing, by a voltage dividing circuit, a power signal to generate an input voltage, wherein the voltage dividing circuit comprises a first resistor and a second resistor coupled in series, a voltage dividing node between the first resistor and the second resistor is configured to generate the input voltage, and the second resistor is coupled between the voltage dividing node and a reference power terminal; reducing a resistance value between the voltage dividing node and the reference power terminal if the input voltage is higher than a voltage threshold; increasing the resistance value between the voltage dividing node and the reference power terminal if the input voltage is lower than or equal to the voltage threshold; generating a flag signal, wherein the flag signal is configured to indicate the input voltage is higher than a voltage threshold, or to indicate the input voltage is lower than or equal to the voltage threshold; generating a first detection signal corresponding to the input voltage; and generating a second detection signal corresponding to a value of the power signal according to the flag signal and the first detection signal.

The above-mentioned voltage monitoring system, voltage monitoring device and voltage monitoring method can reduce the circuit area and the manufacturing difficulty of the circuit.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
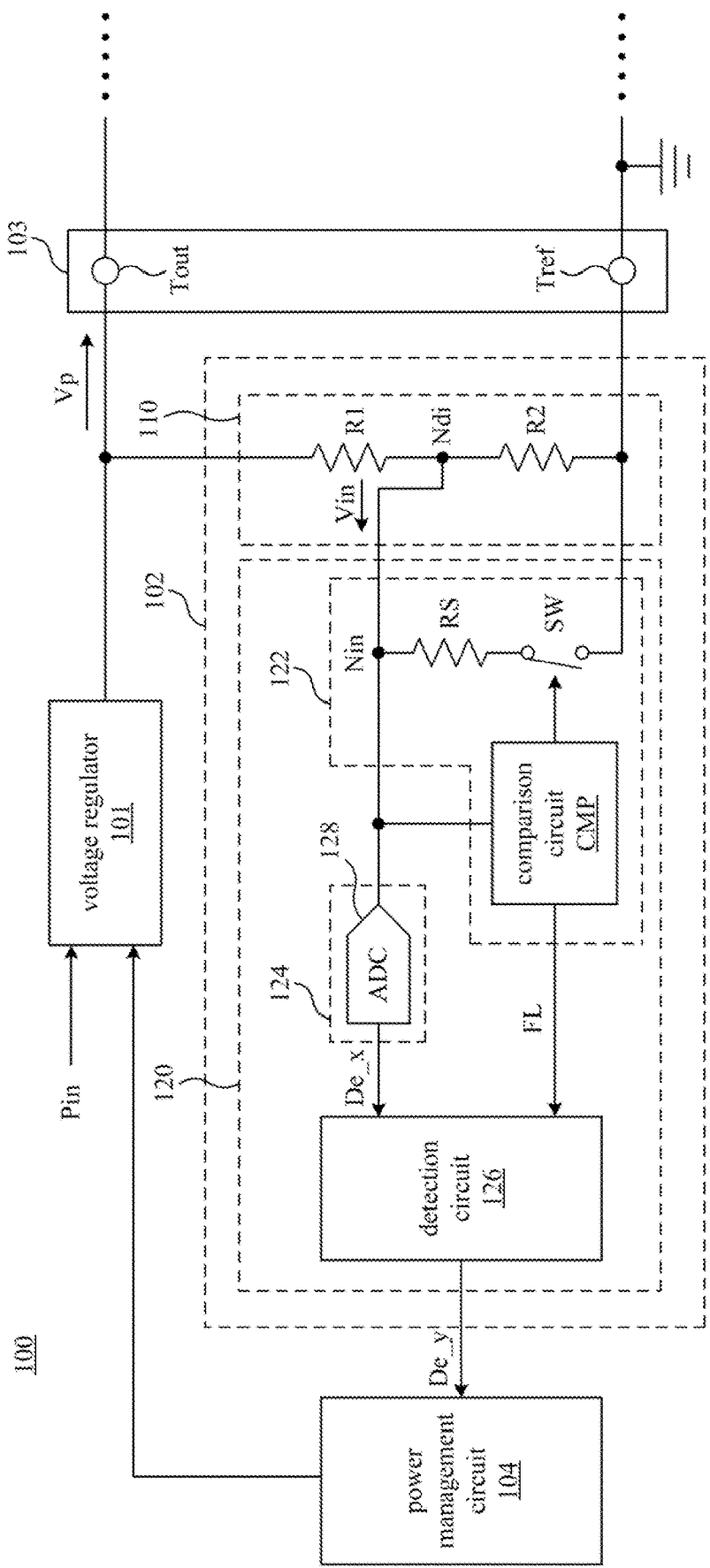
FIG. 1 is a simplified functional block diagram of a power supply device in some embodiments of the present disclosure.

FIG. 1 is a simplified functional block diagram of a power supply device 100 in some embodiments of the present disclosure. The power supply device 100 includes a voltage regulator 101, a voltage monitoring system 102, an output interface 103 and a power management circuit 104. The voltage regulator 101 is configured to convert a power input Pin, so as to provide a power signal Vp to a power output terminal Tout of the output interface 103. In some embodiments, the power input Pin can be from AC grid or lithium battery. In some embodiments, the power supply device 100 supports USB Power Delivery Protocol 3.1 (USB PD 3.1 protocol), and the output interface 103 is a USB port, the voltage regulator 101 can control the power signal Vp in the voltage range of 5-48V, but not limited thereto.

The voltage monitoring system 102 is configured to monitor the power signal Vp, so as to generate a detection signal De_y corresponding to the voltage value of the power signal Vp. The power management circuit 104 can control the voltage regulator 101 according to the detection signal De_y to adjust the power signal Vp. In some embodiments, the power management circuit 104 can use the detection signal De_y to determine whether the power signal Vp has abnormal voltage fluctuation, and then determine whether a fault event (e.g., short circuit) occurs so that the output of the power signal Vp needs to be interrupted. In other words, the voltage monitoring system 102 and the power management circuit 104 form a feedback control loop for the power signal Vp. The components, connections and operations of the voltage monitoring system 102 will be further described below.

The voltage monitoring system 102 includes a voltage dividing circuit 110 and a voltage monitoring device 120. The voltage dividing circuit 110 is coupled between the power output terminal Tout and the reference power terminal Tref of the output interface 103. In some embodiments, the reference power terminal Tref can be a ground terminal. The voltage dividing circuit 110 is configured to divide voltage between the power output terminal Tout and the reference power terminal Tref, that is, divides the power signal Vp to provide the input voltage Vin to the voltage monitoring device 120. The function of the voltage dividing circuit 110 can also be understood as attenuating the power signal Vp, so as to control the input voltage Vin within a voltage range that the voltage monitoring device 120 can withstand.

In one embodiment, the voltage dividing circuit 110 includes a resistor R1 and a resistor R2, and the resistor R1 and the resistor R2 are coupled in series between the power output terminal Tout and the reference power terminal Tref. A voltage dividing node Ndi between the resistor R1 and the resistor R2 is configured to provide the input voltage Vin.

The voltage monitoring device 120 includes an input node Nin, a shunt circuit 122, a detection circuit 124 and a detection circuit 126. The input node Nin is coupled to the voltage dividing node Ndi, and is configured to receive the input voltage Vin from the voltage dividing circuit 110. The shunt circuit 122 is coupled between the input node Nin and the reference power terminal Tref, and is configured to compare the input voltage Vin with the voltage threshold value to selectively conduct the input node Nin to the reference power terminal Tref. The shunt circuit 122 operates in the conducted state when the input voltage Vin is higher than a voltage threshold value, so as to provide an additional resistor coupled in parallel to the resistor R2, thereby reducing the impedance between the input node Nin and the reference power terminal Tref. On the other hand, when the input voltage Vin is lower than or equal to the voltage threshold value, the shunt circuit 122 operates in the switched-off state to increase the impedance between the input node Nin and the reference power terminal Tref. Additionally, the shunt circuit 122 is further configured to generate a flag signal FL to indicate that the shunt circuit 122 currently operates in a conducted state or operates in a switched-off state. For example, a first logic value (e.g., logic 1) of the flag signal FL indicates that the shunt circuit 122 is in the conducted state, and a second logic value (e.g., logic 0) of the flag signal FL indicates that the shunt circuit 122 is in the switched-off state.

In some embodiments, the shunt circuit 122 includes a shunt resistor RS, a switch circuit SW and a comparison circuit CMP. The shunt resistor RS and the switch circuit SW are coupled in series between the input node Nin and the reference power terminal Tref. The comparison circuit CMP is configured to compare the input voltage Vin with the voltage threshold value, and is configured to control the switch circuit SW according to the comparison result. The comparison circuit CMP can turn on the switch circuit SW when the input voltage Vin is higher than the voltage threshold value so that the shunt circuit 122 enters the conducted state. At this time the shunt resistor RS will be coupled in parallel with the resistor R2 to attenuate the power signal Vp to a greater extent. On the other hand, the comparison circuit CMP turns off the switch circuit SW when the input voltage Vin is lower than or equal to the voltage threshold value, so that the shunt circuit 122 enters the above switched-off state, thereby reducing the attenuation of the power signal Vp. The comparison circuit CMP is further configured to generate the above flag signal FL. In some embodiments, the comparison circuit CMP includes a comparator. An input terminal (e.g., the inverting input terminal) of the comparator is configured to receive a voltage signal indicating the voltage threshold value, the other input terminal (e.g., non-inverting input terminal) of the comparator is configured to receive the input voltage Vin, and the output terminal of the comparator is configured to control the switch circuit SW.

By dynamically adjusting the attenuation of the power signal Vp by the shunt circuit 122, the variation of the power signal Vp can be prevented from being excessively attenuated and difficult to monitor. The detailed operation of the shunt circuit 122 will be explained in the following paragraphs in conjunction with FIGS. 2A-2B. The following continues to describe the remaining circuit blocks of the voltage monitoring device 120. The detection circuit 124 is coupled to the input node Nin, and is configured to generate the detection signal De_x corresponding to the value of the input voltage Vin. In this embodiment, the detection circuit 124 is implemented by an analog-to-digital converter (hereinafter referred to as ADC) 128. The input terminal of ADC 128 is configured to receive the input voltage Vin from the input node Nin, and the output terminal of ADC 128 is configured to generate the detection signal De_x. The detection circuit 126 is configured to calculate the voltage value of the power signal Vp according to the flag signal FL and the detection signal De_x, and generate the detection signal De_y corresponding to the voltage value of the power signal Vp.

Figure 2A:
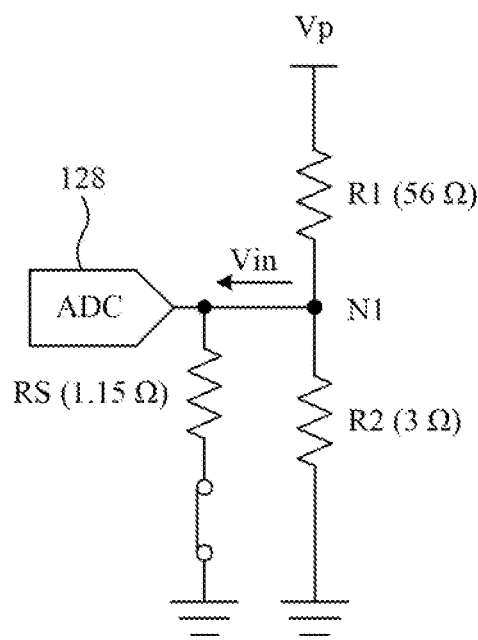
FIG. 2A is a schematic diagram of dynamically adjusting the attenuation of the power signal.
Figure 2B:
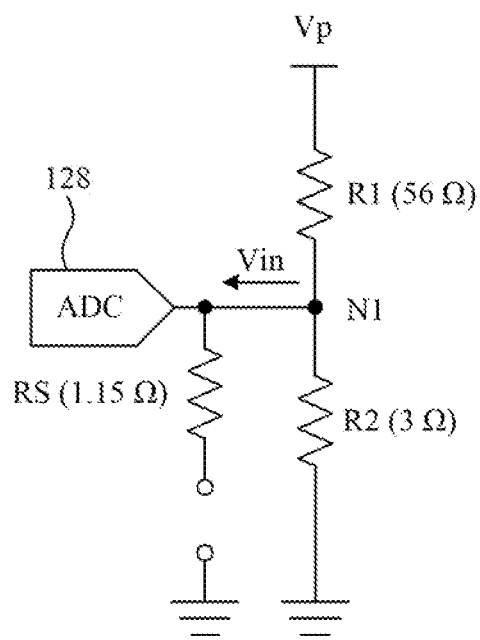
FIG. 2B is a schematic diagram of dynamically adjusting the attenuation of the power signal.
Figure 2B:
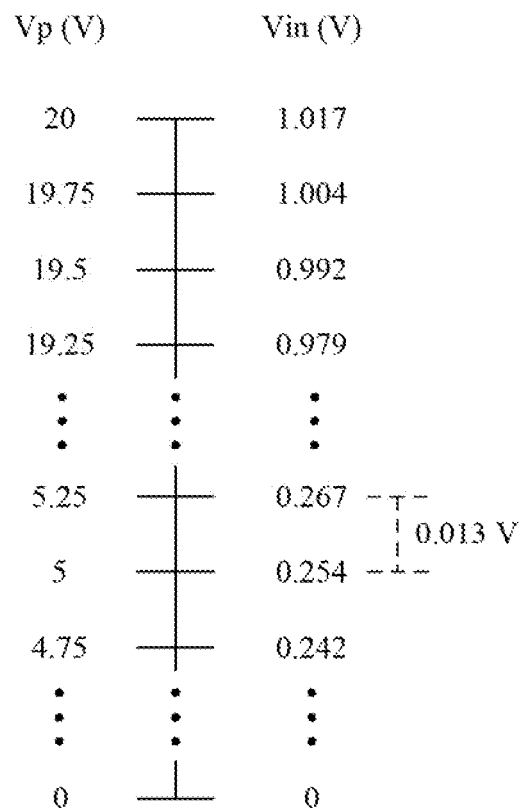

FIGS. 2A-2B are schematic diagrams illustrating that the shunt circuit 122 dynamically adjusts the attenuation of the power signal Vp in an embodiment where the voltage threshold value is 0.419V, wherein the voltage threshold value of 0.419V corresponds to the power signal Vp of 20V. In the following embodiment, the resistor R1, the resistor R2 and the shunt resistor RS are 56 ohms, 3 ohms and 1.15 ohms, respectively, but the present disclosure is not limited thereto. Referring to FIGS. 1-2A. In the operation of FIG. 2A, the power signal Vp output by the power supply device 100 has a voltage higher than 20V, and the upper limit of the voltage is 48V, that is, the power supply device 100 used as a power supply device (source) to provide a greater power to the power consumption device (sink, not shown). The power consumption device can be a notebook computer running a game program, or a smart phone that is fast charging in constant current mode, but not limited thereto. At this time, the comparison circuit CMP determines that the input voltage Vin is higher than the voltage threshold value, and thus turns on the switch circuit SW to attenuate the power signal Vp to a greater extent, and outputs the flag signal FL having a first logic value.

The voltage monitoring system 102 is set to resolve the voltage change of the power signal Vp in units of 0.25V. In the embodiment of FIG. 2A, the voltage monitoring system 102 monitors 112 levels of variation. Therefore, the ADC 128 may be implemented by an ADC with a resolution of 7 bits, but the present disclosure is not limited thereto. In some embodiments, the unit in which the voltage monitoring system 102 resolves the power signal Vp can be adjusted according to actual needs, and the resolution of the ADC 128 can also be adjusted accordingly. In addition, the detection circuit 126 receives from the flag signal FL having the first logic value that the voltage value of the power signal Vp is in a voltage range higher than 20V, so that the voltage value of the power signal Vp can be calculated correctly according to the detection signal De_x.

On the other hand, when the comparison circuit CMP detects that the input voltage Vin is equal to the voltage threshold value (i.e., 0.419V), the comparison circuit CMP enters the operation shown in FIG. 2B, that is, the comparison circuit CMP turns off the switch circuit SW to reduce the attenuation of the power signal Vp, and outputs the flag signal FL having a second logic value. At this time, the power supply device 100 provides a lower power to the power consumption device. The power consumption device can be a notebook computer that is running a word processing program, or a smart phone that is charging in constant voltage mode, but not limited to this. In the case of FIG. 2B, the power signal Vp is in the voltage range of 0-20V, and the voltage monitoring system 102 monitors 80 levels of voltage variation. Therefore, the 7-bit ADC 128 can also meet the needs of analyzing the power signal Vp. The detection circuit 126 can ensure that the power signal Vp is in the voltage range of 0-20V from the flag signal FL having the second logic value, so that the voltage value of the power signal Vp can be calculated correctly according to the detection signal De_x.

It can be seen from FIG. 2A and FIG. 2B that by dynamically adjusting the attenuation of the power signal Vp, the input voltage Vin is substantially in the same voltage range (e.g., substantially between 0-1V) in both cases, and the input range of the ADC 128 is also approximately equal to this voltage range, so that the input range of the ADC 128 can be fully utilized. At this time, with the flag signal FL indicating the voltage range of the power signal Vp, the low-resolution ADC 128 can be used to achieve high-resolution analysis of the power signal Vp. For example, in the embodiment of FIGS. 2A-2B, the voltage monitoring system 102 uses a 7-bit ADC 128 with a resolution of 128 levels to monitor the 192 levels of voltage variation generated by the power signal Vp.

Figure 3:
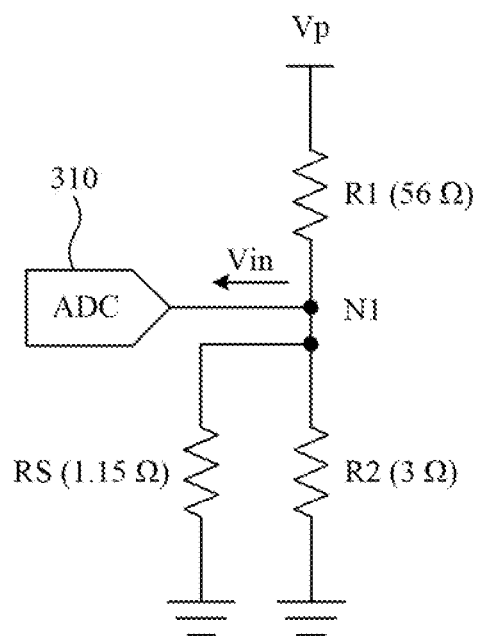
FIG. 3 is a schematic diagram of analyzing the power signal without dynamically adjusting the attenuation.
Figure 3:
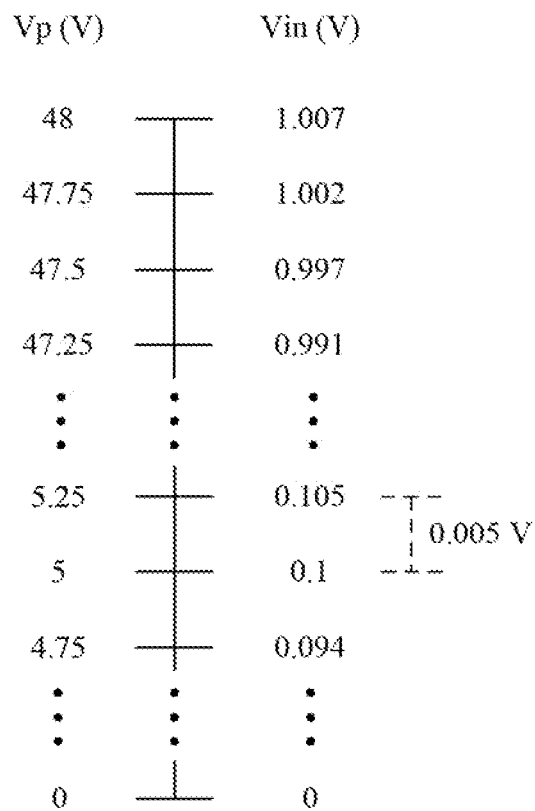

FIG. 3 shows an embodiment without dynamic adjusting the attenuation. Compared with the above embodiment, in order to cover the voltage change of the power signal Vp of 192 levels, the ADC 310 may be implemented with an 8-bit ADC that has a larger circuit area. However, in some usage situations, such as the power consumption device is in a standby state, or the power consumption device only supports the old version of the power delivery protocol, the power signal Vp may be maintained at a low voltage (e.g., 5V), then the power signal Vp monitoring does not require up to 8-bit resolution. In addition, referring to FIG. 2B and FIG. 3, when the power signal Vp is in a lower voltage range, dynamically adjusting the attenuation can avoid the change of the power signal Vp from being excessively attenuated, and amplify the voltage change of the input voltage Vin. For example, when the power signal Vp changes from 5V to 5.25V, the voltage change of the input voltage Vin in FIG. 2B is about 0.013V, and the voltage change of the input voltage Vin in FIG. 3 is only about 0.005V. Therefore, the ADC 310 in FIG. 3 may use high-precision components to obtain high voltage resolution, which will increase the manufacturing difficulty of the ADC 310, and the high voltage resolution will also make the output result of ADC 310 more easily disturbed by noise.

In short, the voltage monitoring system 102 in the above embodiments has the advantages of small circuit area and low manufacturing difficulty.

Figure 4:
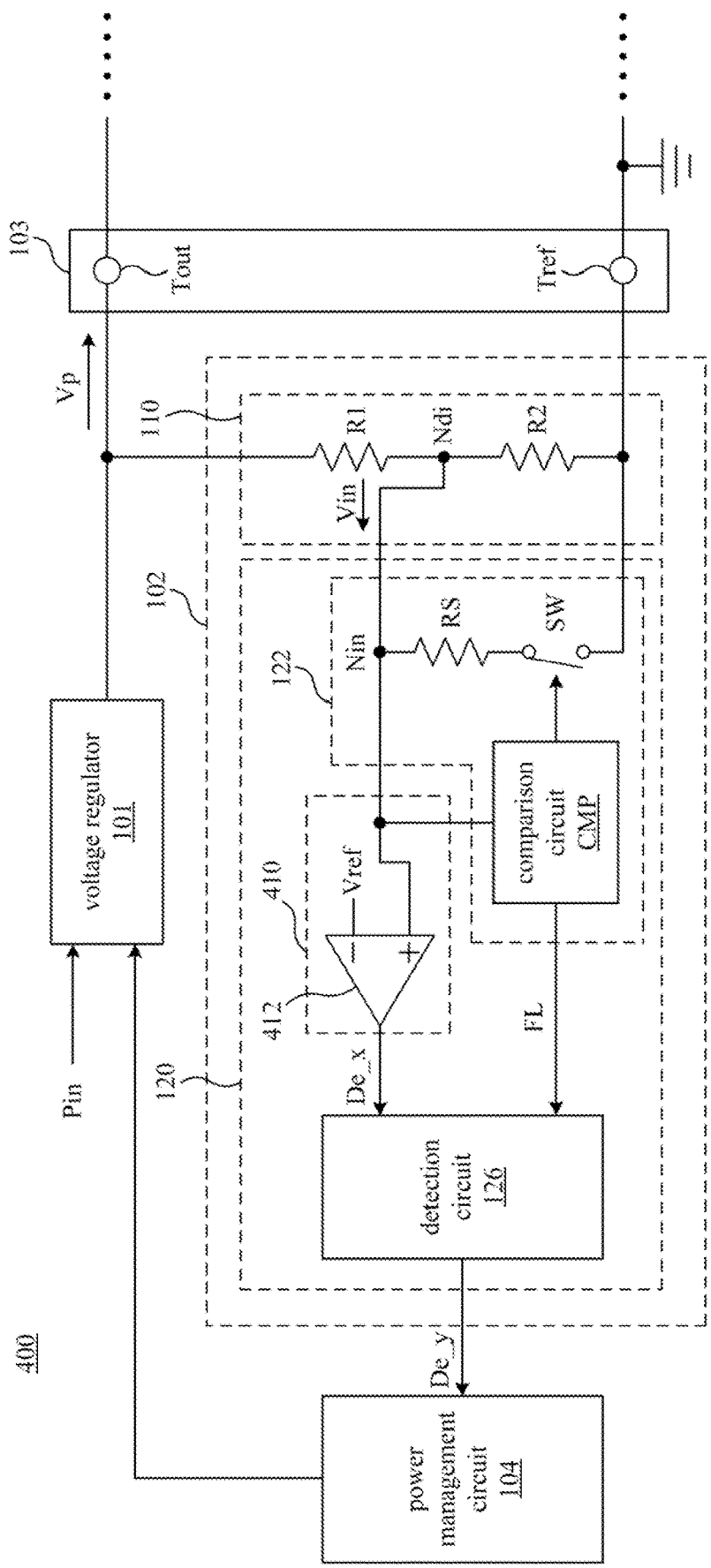
FIG. 4 is a schematic diagram of a power supply device in some embodiments of the present disclosure.

FIG. 4 is a schematic diagram of a power supply device 400 in some embodiments of the present disclosure. The difference between the power supply device 400 in FIG. 4 and the power supply device 100 in FIG. 1 is that the power supply device 400 in FIG. 4 replaces the detection circuit 124 in FIG. 1 with the detection circuit 410. The detection circuit 410 may be implemented by a comparator 412, wherein the first input terminal (e.g., inverting input terminal) of the comparator 412 is configured to receive the reference voltage Vref. The second input terminal (e.g., non-inverting input terminal) of the comparator 412 is configured to receive the input voltage Vin, the output terminal of the comparator 412 is configured to generate the detection signal De_x. The operations, connection methods and advantages of the remaining circuit blocks of the power supply device 400 in FIG. 4 are respectively similar to the corresponding circuit blocks in the power supply device 100 in FIG. 1. For the sake of brevity, it is not repeated here.

In some embodiments, the reference voltage Vref is generated by another voltage dividing circuit (not shown)

similar to the voltage dividing circuit 110. Since the dynamic switching of the attenuation amplifies the variation of the input voltage Vin, the comparator 412 can correctly determine the value of the input voltage Vin even when the reference voltage Vref has a certain degree of deviation. Accordingly, the manufacturing difficulty of the voltage dividing circuit that generates the reference voltage Vref can be reduced.

It is worth noting that, the voltage monitoring system 102 in the above embodiments can also be arranged in the power consumption device, or in any suitable electronic device that monitors voltage. For example, the voltage monitoring system 102 may monitor the power signal Vp from the power supply device, and output the detection signal De_y corresponding to the voltage value of the power signal Vp, so that the power consumption device determines whether it is necessary to require the power supply device to adjust the power signal Vp, or determines whether a fault event occurs and needs to interrupt receiving the power signal Vp.

Figure 5:
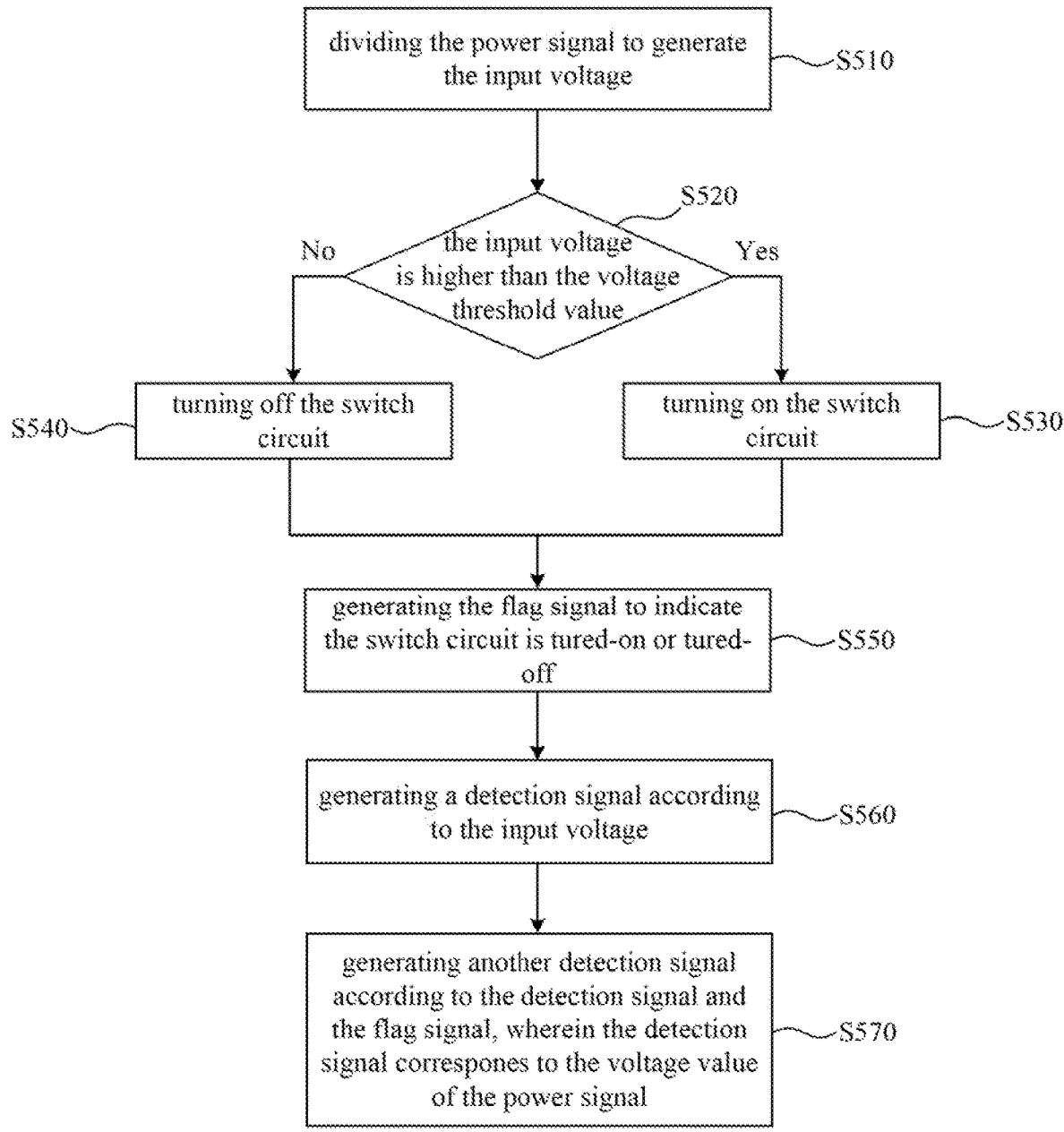
FIG. 5 is a flowchart illustrating a voltage monitoring method in some embodiments of the present disclosure.

FIG. 5 is a flowchart illustrating a voltage monitoring method 500 in some embodiments of the present disclosure. The method 500 can be applied to the voltage monitoring system 102 and the voltage monitoring device 120 in the foregoing embodiments. In step S510, the voltage dividing circuit 110 divides the power signal Vp to generate the input voltage Vin. As shown in FIG. 1, a voltage dividing node Ndi between the resistor R1 and the resistor R2 of the voltage dividing circuit 110 is configured to generate the input voltage Vin, and the resistor R2 is coupled between the voltage dividing node Ndi and the reference power terminal Tref.

In step S520, the comparison circuit CMP compares the input voltage Vin with the voltage threshold value. If the input voltage Vin is higher than the voltage threshold value, then the step S530 is executed. If the input voltage Vin is lower than or equal to the voltage threshold value, then the step S540 is executed.

In step S530, the switch circuit SW is turned on, so that the shunt resistor RS is coupled to the resistor R2 in parallel, so as to reduce the resistance between the voltage dividing node Ndi and the reference power terminal Tref.

In step S540, the switch circuit SW is turned off, so as to increase the resistance between the voltage dividing node Ndi and the reference power terminal Tref.

In step S550, the comparison circuit CMP generates the flag signal FL. The flag signal FL is configured to indicate the switch circuit SW is tured-on or tured-off. In other words, the flag signal FL is configured to indicate a determination result that the input voltage Vin is higher than the voltage threshold value, or is lower than or equal to the voltage threshold value.

In step S560, the detection circuit 124 generates a detection signal De_x according to the input voltage Vin.

In step S570, the detection circuit 126 generates another detection signal De_y according to the detection signal De_x and the flag signal FL, wherein the detection signal De_y corresponds to the voltage value of the power signal Vp.

It should be understood that any method described herein may include more or fewer steps than those shown in the flowcharts, and the flow within a method can be executed in any suitable order. For example, the step S530 and the step S550 may be performed simultaneously. For another example, the step S540 and the step S550 may be executed simultaneously.

The specification and claims use certain terms to refer to specific elements. However, a person having ordinary skill in the art should understand that the same element may be called by different terms. The specification and claims do not use the difference in terms as the way to distinguish the components, but use the functional difference of the components as the basis for the distinction. The "include" mentioned in the specification and claims is an open-ended term, so it should be interpreted as "including but not limited to". In addition, "couple" herein includes any direct and indirect method of connection. Therefore, if the present disclosure describes that the first element is coupled to the second element, it means that the first element can be directly connected to the second element through electrical connection or signal connection such as wireless transmission, optical transmission, or indirectly electrically or signally connected to the second element through other elements or connection methods.

Furthermore, unless otherwise stated in the specification, any singular term also includes the meaning of the plural.

The above contents are only some examples of the present disclosure, and all equivalent changes and modifications made in accordance with the requirements of the present disclosure shall fall within the scope of the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A voltage monitoring system, comprising:
   a voltage dividing circuit configured to divide a power signal to generate an input voltage; and
   a voltage monitoring device, comprising:
   an input node configured to receive the input voltage;
   a shunt circuit coupled between the input node and a reference power terminal, configured to compare the input voltage with a voltage threshold value to selectively operate in a conducted state or a switched-off state, and configured to output a flag signal to indicate the conducted state or the switched-off state of the shunt circuit;
   a first detection circuit coupled to the input node, and configured to generate a first detection signal corresponding to a value of the input voltage; and
   a second detection circuit configured to generate, according to the flag signal and the first detection signal, a second detection signal corresponding to a value of the power signal.

2. The voltage monitoring system of claim 1, wherein the shunt circuit comprises:
   a shunt resistor;
   a switch circuit coupled in series with the shunt resistor between the input node and the reference power terminal; and
   a comparison circuit configured to compare the input voltage with the voltage threshold value, wherein the comparison circuit is configured to turn on the switch circuit to make the shunt circuit operate in the conducted state, and to turn off the switch circuit to make the shunt circuit operate in the switched-off state.

3. The voltage monitoring system of claim 2, wherein the shunt circuit is configured to operate in the conducted state when the input voltage is higher than the voltage threshold value, and is configured to operate in the switched-off state when the input voltage is lower than or equal to the voltage threshold value.

4. The voltage monitoring system of claim 1, wherein the shunt circuit is configured to operate in the conducted state when the input voltage is higher than the voltage threshold value, and is configured to operate in the switched-off state when the input voltage is lower than or equal to the voltage threshold value.

5. The voltage monitoring system of claim 1, wherein the first detection circuit comprises an analog-to-digital converter, an input terminal of the analog-to-digital converter is configured to receive the input voltage, and an output terminal of the analog-to-digital converter is configured to generate the first detection signal.

6. The voltage monitoring system of claim 1, wherein the input voltage corresponding to the conducted state and the input voltage corresponding to the switched-off state are substantially in a same voltage range.

7. A voltage monitoring device configured to be coupled to a voltage dividing circuit, wherein the voltage dividing circuit is configured to divide a power signal to generate an input voltage, and the voltage monitoring device comprises:
an input node configured to receive the input voltage;
a shunt circuit coupled between the input node and a reference power terminal, configured to compare the input voltage with a voltage threshold value to selectively operate in a conducted state or a switched-off state, and configured to output a flag signal to indicate the conducted state or the switched-off state of the shunt circuit;
a first detection circuit coupled to the input node, and configured to generate a first detection signal corresponding to a value of the input voltage; and
a second detection circuit configured to generate, according to the flag signal and the first detection signal, a second detection signal corresponding to a value of the power signal.

8. The voltage monitoring device of claim 7, wherein the shunt circuit comprises:
a shunt resistor;
a switch circuit coupled in series with the shunt resistor between the input node and the reference power terminal; and
a comparison circuit configured to compare the input voltage with the voltage threshold value, wherein the comparison circuit is configured to turn on the switch circuit to make the shunt circuit operate in the conducted state, and to turn off the switch circuit to make the shunt circuit operate in the switched-off state.

9. The voltage monitoring device of claim 8, wherein the shunt circuit is configured to operate in the conducted state when the input voltage is higher than the voltage threshold value, and is configured to operate at the switched-off state when the input voltage is equal to or lower than the voltage threshold value.

10. The voltage monitoring device of claim 7, wherein the shunt circuit is configured to operate in the conducted state when the input voltage is higher than the voltage threshold value, and is configured to operate at the switched-off state when the input voltage is equal to or lower than the voltage threshold value.

11. The voltage monitoring device of claim 7, wherein the first detection circuit comprises an analog-to-digital converter, an input terminal of the analog-to-digital converter is configured to receive the input voltage, and an output terminal of the analog-to-digital converter is configured to generate the first detection signal.

12. The voltage monitoring device of claim 7, wherein the input voltage corresponding to the conducted state and the input voltage corresponding to the switched-off state are substantially in a same voltage range.

* * * * *